US011824507B2

(12) United States Patent
Coover et al.

(10) Patent No.: US 11,824,507 B2
(45) Date of Patent: *Nov. 21, 2023

(54) METHODS AND APPARATUS FOR VOLUME ADJUSTMENT

(71) Applicant: GRACENOTE, INC., Emeryville, CA (US)

(72) Inventors: Robert Coover, Orinda, CA (US); Jeffrey Scott, Berkeley, CA (US); Markus K. Cremer, Orinda, CA (US); Aneesh Vartakavi, Emeryville, CA (US)

(73) Assignee: Gracenote, Inc., Emeryville, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/074,169

(22) Filed: Dec. 2, 2022

(65) Prior Publication Data

US 2023/0216461 A1 Jul. 6, 2023

Related U.S. Application Data

(63) Continuation of application No. 17/018,773, filed on Sep. 11, 2020, now Pat. No. 11,545,949, which is a (Continued)

(51) Int. Cl.
*H03G 3/30* (2006.01)
*H03F 3/183* (2006.01)
(Continued)

(52) U.S. Cl.
CPC ........... *H03G 3/3005* (2013.01); *H03F 3/183* (2013.01); *H03G 3/02* (2013.01); *H03G 3/3089* (2013.01);
(Continued)

(58) Field of Classification Search
CPC ...... H03G 3/3005; H03G 3/02; H03G 3/3089; H03G 7/002; H03F 3/183; H03F 2200/03; H04R 3/00
See application file for complete search history.

(56) References Cited

U.S. PATENT DOCUMENTS 8,284,959 B2   10/2012   Moon et al.
8,681,998 B2    3/2014   Noguchi
(Continued)

FOREIGN PATENT DOCUMENTS

CN   102113313   6/2011
EP   3193447     7/2017
(Continued)

OTHER PUBLICATIONS

Korean Intellectual Property Office, "Notice of Preliminary Rejection," dated Jun. 7, 2022 in connection, with Korean Patent Application No. 10-2020-7022939, 12 pages, including translation.
(Continued)

*Primary Examiner* — David L Ton
(74) *Attorney, Agent, or Firm* — McDonnell Boehnen Hulbert & Berghoff LLP

(57) ABSTRACT

Apparatus, systems, articles of manufacture, and methods for volume adjustment are disclosed herein. An example method includes collecting data corresponding to a volume of an audio signal as the audio signal is output through a device, when an average volume of the audio signal does not satisfy a volume threshold for a specified timespan, determining a difference between the average volume and a desired volume, and applying a gain to the audio signal to adjust the volume of the audio signal to the desired volume, the gain determined based on the difference between the average volume and the desired volume.

20 Claims, 6 Drawing Sheets

Related U.S. Application Data continuation of application No. 16/241,739, filed on Jan. 7, 2019, now Pat. No. 10,778,168.

(60) Provisional application No. 62/614,439, filed on Jan. 7, 2018.

(51) Int. Cl.
*H03G 7/00* (2006.01)
*H04R 3/00* (2006.01)
*H03G 3/02* (2006.01)

(52) U.S. Cl.
CPC .............. *H03G 7/002* (2013.01); *H04R 3/00* (2013.01); *H03F 2200/03* (2013.01)

(56) References Cited

U.S. PATENT DOCUMENTS

| | | |
|---|---|---|
| 9,148,104 B2 | 9/2015 | Yamashita et al. |
| 9,413,322 B2 | 8/2016 | Soulodre et al. |
| 9,755,605 B1 | 9/2017 | Li et al. |
| 2005/0049735 A1 | 3/2005 | Kim et al. |
| 2010/0027812 A1 | 2/2010 | Moon et al. |
| 2010/0208918 A1 | 8/2010 | Noguchi |
| 2012/0114127 A1 | 5/2012 | Yamashita et al. |
| 2014/0328500 A1 | 11/2014 | Patwardhan et al. |
| 2015/0189438 A1 | 7/2015 | Hampiholi et al. |
| 2017/0201219 A1 | 7/2017 | Baumgarte et al. |
| 2017/0207762 A1 | 7/2017 | Porter et al. |
| 2017/0295412 A1 | 10/2017 | Carroll et al. |
| 2019/0214954 A1 | 7/2019 | Coover et al. |

FOREIGN PATENT DOCUMENTS

| | | |
|---|---|---|
| JP | H04-044004 | 4/1992 |
| JP | 2003348682 | 12/2003 |
| JP | 2009021834 | 1/2009 |
| JP | 2010192954 | 9/2010 |
| JP | 2010258776 | 11/2010 |
| JP | 2012104992 | 5/2012 |
| JP | 2013168807 | 8/2013 |
| KR | 2015-0086263 A | 7/2015 |
| WO | 2016202682 | 12/2016 |
| WO | 2019136371 | 7/2019 |

OTHER PUBLICATIONS

Japanese Patent Office, "Notice of Allowance," dated Apr. 5, 2022 in connection with Japanese Patent Application No. 2020-537547, 3 pages.

European Patent Office, "Extended European Search Report," dated Aug. 23, 2021, in connection with European Patent Application No. 19735794.0, 10 pages.

Japanese Patent Office, "Notice of Reasons for Rejection," dated Oct. 5, 2021 in connection with Japanese Patent Application No. 2020-537547, 7 pages (including translation).

International Searching Authority, "International Preliminary Report on Patentability," dated Jul. 7, 2020 in connection with International Patent Application No. PCT/US2019/012524, 6 pages.

Patent Cooperation Treaty, "Search Report," issued in connection with International Patent Application No. PCT/US2019/012524, dated Apr. 30, 2019, 5 pages.

International Searching Authority,"Written Opinion," issued in connection with International Patent Application No. PCT/US2019/012524, dated Apr. 30, 2019, 5 pages.

International Telecommunication Union, "Algorithms to measure audio programme loudness and true-peak audio level," [http://www.itu.int/publ/R-REC/en], BS Series, Broadcasting Service {sound), Geneva 2017, 25 pages.

United States Patent and Trademark Office, "Non-Final Office Action," issued in connection with U.S. Appl. No. 16/241,739, dated Jan. 16, 2020, 12 pages.

United States Patent and Trademark Office, "Notice of Allowance," issued in connection with U.S. Appl. No. 16/241,739, dated Jul. 29, 2020, 12 pages.

METHODS AND APPARATUS FOR VOLUME ADJUSTMENT

RELATED APPLICATION(S)

The present application is a continuation of U.S. patent application Ser. No. 17/018,773, filed Sep. 11, 2020, which is a continuation of U.S. patent application Ser. No. 16/241,739, filed Jan. 7, 2019, now U.S. Pat. No. 10,778,168, which claims the benefit of and priority to U.S. Provisional Application No. 62/614,439, filed on Jan. 7, 2018. The entire disclosure contents of these applications are herewith incorporated by reference into the present application.

FIELD OF THE DISCLOSURE

This disclosure relates generally to volume adjustment, and, more particularly, to methods and apparatus for volume adjustment.

BACKGROUND

In recent years, a multitude of media of varying characteristics has been delivered using an increasing number of channels. Audio media, specifically, may be received using more traditional channels (e.g., the radio), or using more recently developed channels, such as using Internet-connected streaming devices. As these channels have developed, systems which are able to process and output audio from multiple sources have been developed as well. Some automobile media systems, for example, are capable of delivering media from compact discs (CD's), Bluetooth connecting devices, universal serial bus (USB) connected devices, Wi-Fi connected devices, auxiliary inputs, and other sources.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
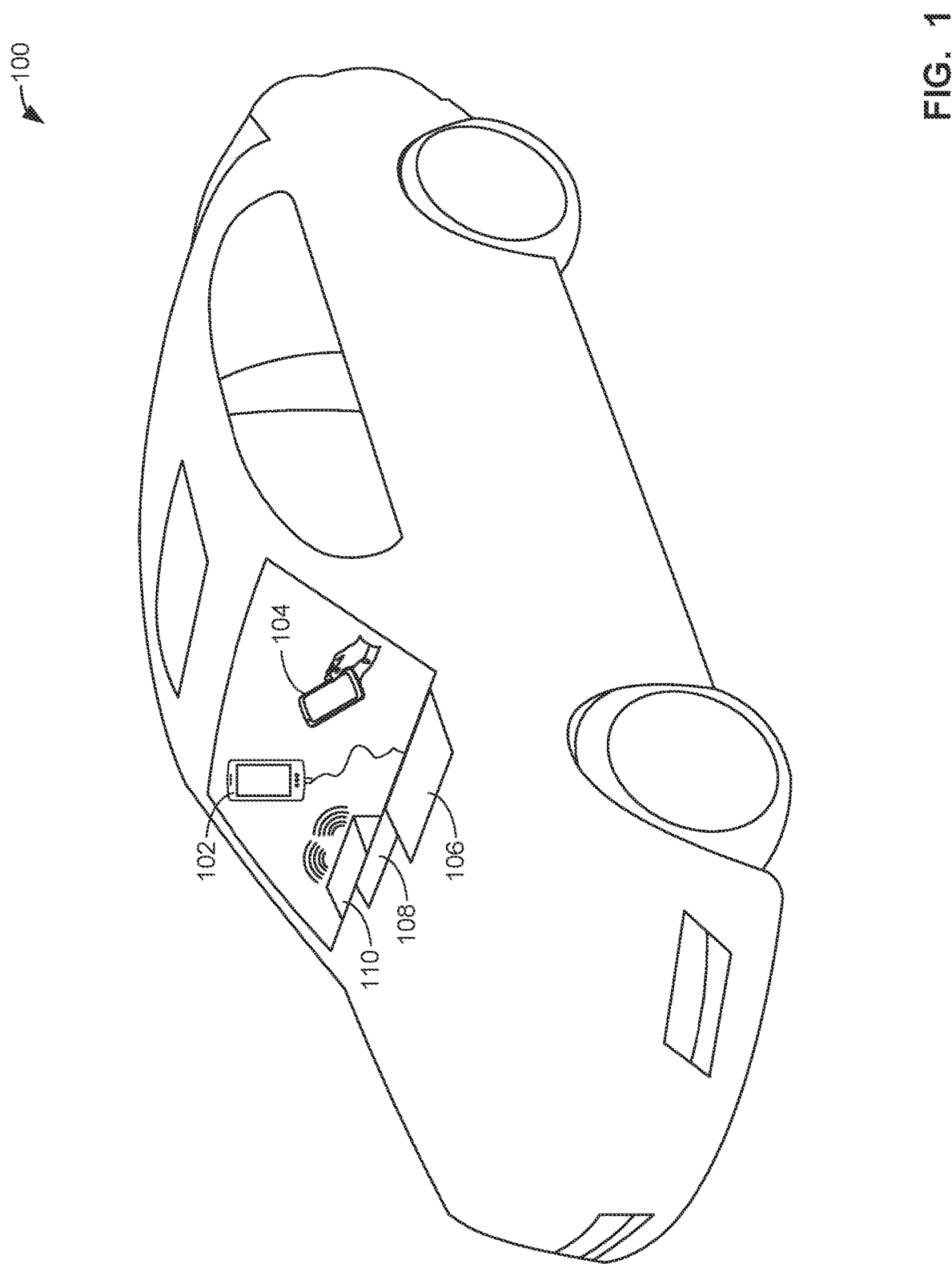
FIG. 1 is a schematic illustration of an example system constructed in accordance with the teachings of this disclosure for volume adjustment.

In conventional audio media implementations, audio signals associated with different media may have different volumes. For example, media on one CD may be recorded and/or mastered at a significantly different volume than media of another CD. Similarly, media retrieved from a streaming device may have significantly different volume levels than media retrieved from a different device, or media retrieved from the same device via a different application. As users increasingly listen to media from a variety of different sources, differences in volume levels between sources and between media of the same source can become very noticeable, and potentially irritating to a listener.

In some conventional approaches to volume regularization, dynamic range compressors are utilized to compress the overall dynamic range of an audio signal to satisfy a volume threshold. In some conventional implementations, such dynamic range compression continually monitors and adjusts the volume of the audio signal in order to satisfy a volume threshold for the audio signal. Such continuous adjustment has an impact on a listener's perception of the audio signal, as the original dynamics of the track are significantly altered. In some examples, dynamic range compression significantly degrades the perceived quality of the audio signal.

In example methods, apparatus, systems and articles of manufacture disclosed herein, media metadata is used to determine an average audio level for a unit of media (e.g., a song, track, etc.). The average audio level is then utilized to determine an appropriate gain value to apply to the audio signal to achieve a desired volume level (also referred to herein as a target volume level). In some examples, the desired volume level is maintained throughout all audio signals such that all signals are output at a consistent average volume level to enable an optimal user experience. Further, in some examples, the volume level is monitored at regular increments during output of the audio signal to determine whether the volume level of the segments has an average volume that satisfies the volume threshold. In such examples, the volume can again be dynamically adjusted to account for differences between the volume during the segment and the desired volume level. Further, for media that has been altered or adjusted such that the volume levels are no longer the same as the volume levels represented in the media, the monitoring at regular increments will prevent the incorrect gain based on the metadata from adjusting the volume of the audio signal to be outside the desired range.

In example methods, apparatus, systems and articles of manufacture disclosed herein, volume levels may be adjusted to ensure the volume remains within a safe listening volume range. For example, if a relatively quiet track is amplified, and then playback transitions to a track which already has very high volume, the volume level would need to be adjusted to avoid playing the new track at a dangerous volume level (e.g., a volume level which may damage human hearing or rendering equipment relatively quickly). In some examples disclosed herein, a buffer (e.g., a one-second buffer, a three-second buffer, etc.) is employed to act as a delay between the time the audio signal is input from a source (e.g., a disc, a radio station, a mobile phone, etc.) and the time it is output, thereby preventing rapid fluctuations in volume levels, and enabling analysis and adjustment of volume levels during the buffer period.

In some example techniques disclosed herein, audio watermarks are utilized to identify media in order to retrieve metadata pertaining to the audio signal. Audio watermarking is a technique used to identify media such as television broadcasts, radio broadcasts, advertisements (television and/or radio), downloaded media, streaming media, prepackaged media, etc. Existing audio watermarking techniques identify media by embedding one or more audio codes (e.g., one or more watermarks), such as media identifying information and/or an identifier that may be mapped to media identifying information, into an audio and/or video component. In some examples, the audio or video component is selected to have a signal characteristic sufficient to hide the watermark. As used herein, the terms "code," or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify fingerprinted media, the watermark(s) are extracted and used to access a table of reference watermarks that are mapped to media identifying information.

In some example techniques disclosed herein, audio fingerprints are utilized to identify media in order to retrieve metadata pertaining to the audio signal. Audio fingerprinting is a technique used to identify media such as television broadcasts, radio broadcasts, advertisements (television and/or radio), downloaded media, streaming media, prepackaged media, etc. Unlike media monitoring techniques based on codes and/or watermarks included with and/or embedded in the monitored media, fingerprint or signature-based media monitoring techniques generally use one or more inherent characteristics of the monitored media during a monitoring time interval to generate a substantially unique proxy for the media. Such a proxy is referred to as a signature or fingerprint, and can take any form (e.g., a series of digital values, a waveform, etc.) representative of any aspect(s) of the media signal(s) (e.g., the audio and/or video signals forming the media presentation being monitored). A signature may be a series of signatures collected in series over a timer interval. A good signature is repeatable when processing the same media presentation, but is unique relative to other (e.g., different) presentations of other (e.g., different) media. Accordingly, the term "fingerprint" and "signature" are used interchangeably herein and are defined herein to mean a proxy for identifying media that is generated from one or more inherent characteristics of the media.

Signature-based media monitoring generally involves determining (e.g., generating and/or collecting) signature(s) representative of a media signal (e.g., an audio signal and/or a video signal) output by a monitored media device and comparing the monitored signature(s) to one or more references signatures corresponding to known (e.g., reference) media sources. Various comparison criteria, such as a cross-correlation value, a Hamming distance, etc., can be evaluated to determine whether a monitored signature matches a particular reference signature. When a match between the monitored signature and one of the reference signatures is found, the monitored media can be identified as corresponding to the particular reference media represented by the reference signature that with matched the monitored signature. Because attributes, such as an identifier of the media, a presentation time, a broadcast channel, etc., are collected for the reference signature, these attributes may then be associated with the monitored media whose monitored signature matched the reference signature.

In some example techniques disclosed herein, audio signals are identified by text matching (e.g., utilizing text pertaining to an artist, album, title, etc.) or using identifiers associated with the audio signal (e.g., a catalog identifier embedded in an ID3 tag, an ISRC identifier, etc.). Example techniques disclosed herein may utilize any audio signal identification technique to identify audio signals.

In some example techniques disclosed herein, audio signals that are not identifiable, and hence audio signals for which metadata is not available, are dynamically compressed so as to maintain the desired volume level. For example, a commercial may play in between identifiable audio signals pertaining to media with metadata. In such an example, the volume level would be adjusted based on the average volume level for each of the identifiable audio signals and dynamic compression would be used to adjust the volume level of the commercial in between, to avoid a drastic shift in volume.

In examples disclosed herein, volume adjustment may be performed by a component of, or by a component in communication with, an audio system of a vehicle. In some examples, a media unit including a dynamic volume adjuster or other component capability of dynamic volume adjustment may be included in the vehicle's head unit. In such examples, the vehicle head unit may receive audio signals from an auxiliary input, a CD input, a radio signal receiver input, an external stream from a smart device, a Bluetooth input, a network connection (e.g., a connection to the Internet), or via any other source. For example, the dynamic volume adjustment may be performed on a media system in a home entertainment system, wherein multiple sources (e.g., a DVD player, a set top box, etc.) may communicate audio signals that are dynamically adjusted to attempt to normalize volume levels between sources and media. In other examples, dynamic volume adjustment may be performed in any setting or for any media device(s).

In example methods, apparatus, systems and articles of manufacture disclosed herein, a volume setting specified by a user is stored in association with data identifying a source type. For example, a volume level selected by a user while operating their mobile device may be stored. Additionally or alternatively, the volume level may be automatically adjusted utilizing techniques disclosed herein to satisfy a user preference or a safety requirement when a specific input source is in use. Some such volume levels can be leveraged when a source change occurs to configure an initial volume level. For example, if the user switches an audio source from a radio to the mobile device, example techniques disclosed herein reference a historical audio setting for the mobile device to configure an initial volume level. Similarly, historical volume settings can be used to compare current volume levels for an input source with historical levels and make adjustments to ensure a consistent and safe listener experience.

FIG. 1 is a schematic illustration of an example system 100 constructed in accordance with the teachings of this disclosure for volume adjustment. The example system 100 includes media devices 102, 104 that transmit audio signals to a media unit 106. The media unit 106 processes the audio signals and transmits the signals to an audio amplifier 108, which subsequently outputs the amplified audio signal to be presented via an output device 110.

The example media device 102 of the illustrated example of FIG. 1 is a portable media player (e.g., an MP3 player). The example media device 102 stores or receives audio signals corresponding to media and is capable of transmitting the audio signals to other devices. In the illustrated example of FIG. 1, the media device 102 transmits audio signals to the media unit 106 via an auxiliary cable. In some examples, the media device 102 may transmit audio signals to the media unit 106 via any other interface.

The example media device 104 of the illustrated example of FIG. 1 is a mobile device (e.g., a cell phone). The example media device 104 stores or receives audio signals corresponding to media and is capable of transmitting the audio signals to other devices. In the illustrated example of FIG. 1, the media device 104 transmits audio signals to the media unit 106 wirelessly. In some examples, the media device 104 may use Wi-Fi, Bluetooth, and/or any other technology to transmit audio signals to the media unit 106. In some examples, the media device 104 may interact with components of a vehicle or other devices for a listener to select media for presentation in the vehicle. The media devices 102, 104 may be any devices which are capable of storing and/or accessing audio signals. In some examples, the media devices 102, 104 may be integral to the vehicle (e.g., a CD player, a radio, etc.).

The example media unit 106 of the illustrated example of FIG. 1 is capable of receiving audio signals and processing them. In the illustrated example of FIG. 1, the example media unit 106 receives media signals from the media devices 102, 104 and processes them to perform volume adjustment. The example media unit 106 is capable of identifying audio signals based on identifiers embedded in or derived from the media (e.g., fingerprints, watermarks, signatures, etc.). The example media unit 106 is additionally capable of accessing metadata corresponding to media associated with an audio signal. In some examples, the metadata is stored in a storage device of the media unit 106. In some examples, the metadata is accessed from another location (e.g., from a server via a network). Further, the example media unit 106 is capable of performing dynamic volume adjustment by determining and applying average gain values based on the metadata to adjust the average volume of an audio signal to satisfy a volume threshold. The example media unit 106 is additionally capable of monitoring audio that is being output by the output device 110 to determine the average volume level of audio segments in real time. In the event that an audio signal is not identified as corresponding to media, and/or in the event that metadata including volume information is not available for an audio signal, the example media unit 106 is capable of dynamic range compression to provide compression of the audio signal to achieve a desired volume level. In some examples, the example media unit 106 is included as part of another device in a vehicle (e.g., a car radio head unit). In some examples, the example media unit 106 is implemented as software and is included as part of another device, available either through a direct connection (e.g., a wired connection) or through a network (e.g., available on the cloud). In some examples, the example media unit 106 may be incorporated with the audio amplifier 108 and the output device 110 and may output audio signals itself following processing of the audio signals.

The example audio amplifier 108 of the illustrated example of FIG. 1 is a device that is capable of receiving the audio signal that has been processed by the media unit 106 and performing the appropriate amplification of the signal for output by the output device 110. In some examples, the audio amplifier 108 may be incorporated into the output device 110. In some examples, the audio amplifier 108 amplifies the audio signal based on an amplification output value from the media unit 106. In some examples, the audio amplifier 108 amplifies the audio signal based on an input from a listener (e.g., a passenger or driver in a vehicle adjusting a volume selector).

The example audio output device 110 of the illustrated example of FIG. 1 is a speaker. In some examples, the audio output device 110 may be multiple speakers, headphones, or any other device capable of presenting audio signals to a listener. In some examples, the output device 110 may be capable of outputting visual elements (e.g., video) as well (e.g., a television with speakers). In some such examples, the visual elements may be utilized to identify media (e.g., based on a watermark included in the video, based on a fingerprint derived from the video, etc.). In some such examples, in addition to or alternatively to volume adjustment, techniques described herein may be implemented to adjust characteristics of the video (e.g., adjust a luminance, perform gamma correction, perform color balance correction, etc.) based on identification of the media represented in the video.

While the illustrated example system 100 of FIG. 1 is described in reference to a volume adjustment implementation in a vehicle, some or all of the devices included in the example system 100 may be implemented in any environment, and in any combination. For example, the system 100 may be in an entertainment room of a house, wherein the media devices 102, 104 may be gaming consoles, virtual reality devices, set top boxes, or any other devices capable of accessing and/or transmitting media. Additionally, in some examples, the media may include visual elements as well (e.g., television shows, films, etc.).

Figure 2:
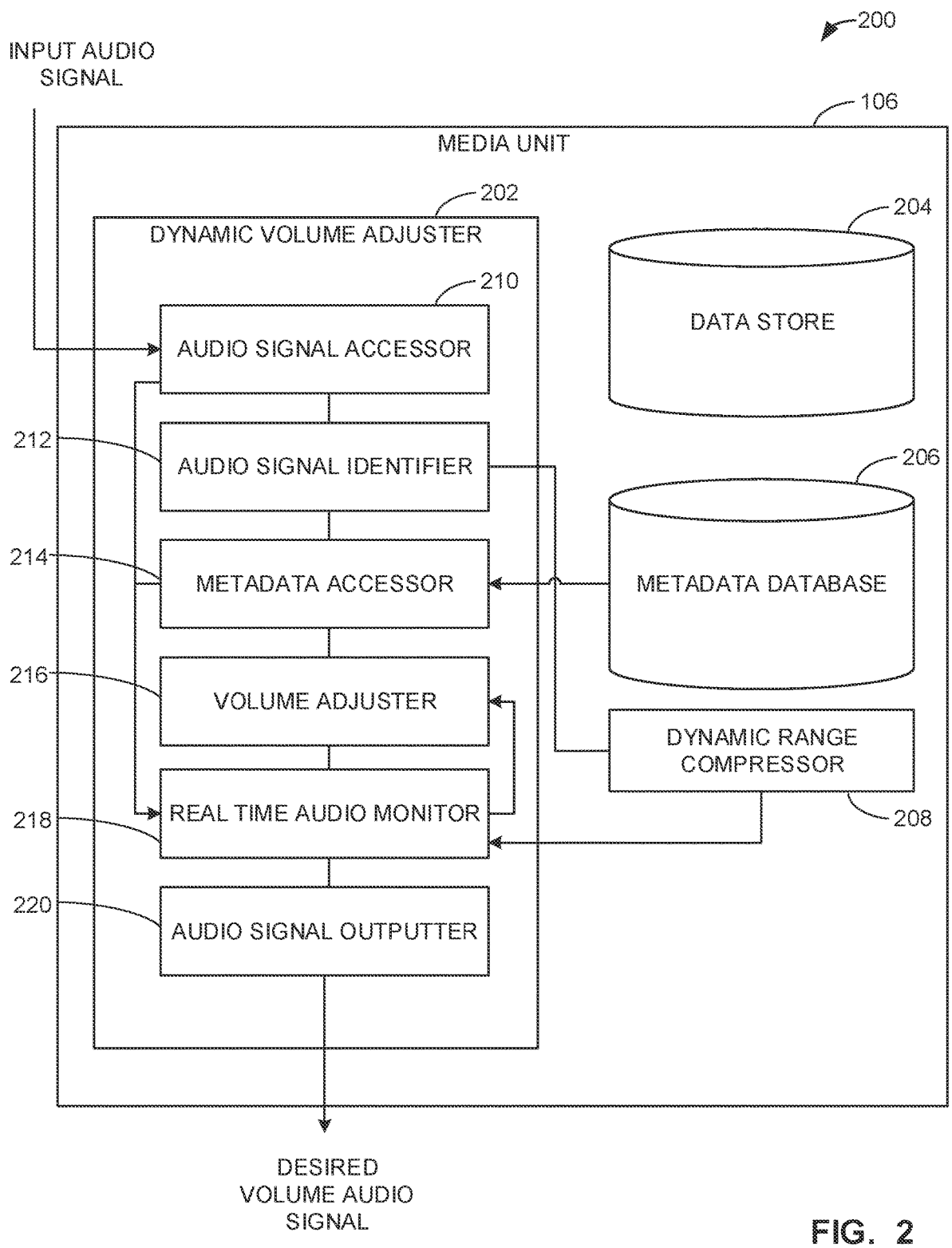
FIG. 2 a block diagram showing additional detail of the media unit of FIG. 1.

A block diagram 200 providing additional detail of an example implementation of the media unit 106 is illustrated in FIG. 2. The example media unit 106 is capable of receiving an audio signal and processing the audio signal to dynamically adjust the volume of the audio signal to a desired level. Following the dynamic volume adjustment, the example media unit 106 transmits the audio signal to the audio amplifier 108 for amplification prior to output by the output device 110.

As shown in FIG. 2, the illustrated example media unit 106 contains a dynamic volume adjuster 202, a data store 204, a metadata database 206, and a dynamic range compressor 208. The dynamic volume adjuster 202 further includes an audio signal accessor 210, an audio signal identifier 212, a metadata accessor 214, a volume adjuster 216, a real time audio monitor 218, and an audio signal outputter 220.

The example dynamic volume adjuster 202 is capable of receiving an audio signal and performing dynamic volume adjustment on the audio signal. In some examples, the example dynamic volume adjuster 202 identifies audio signals that are accessed by the dynamic volume adjuster 202. In some examples, the dynamic volume adjuster 202 may access the audio signals from the data store 204 where the signals may be temporarily stored during processing. In some examples, the dynamic volume adjuster 202 utilizes identifiers embedded in the audio signal to determine the media corresponding to the audio signal. The example dynamic volume adjuster 202 may use any technique to determine the media that corresponds to the received audio signal. In some examples, the volume adjuster 202 is capable of obtaining metadata corresponding to volume information (e.g., average volume across a unit of media, average volume during a segment of media, etc.). In some examples, the example volume adjuster 202 is capable of determining an appropriate average gain value to apply to an audio signal to achieve a desired average volume for the audio signal. In some examples, the example volume adjuster 202 presents (e.g., outputs) the audio signal to the audio amplifier 108 of the illustrated example of FIG. 1 in samples and continually collects real time volume measurements on the samples as the audio sample is presented. In such examples, the example volume adjuster 202 generates an average volume level for segments of the audio signal (e.g., three second segments) and determines if the average volume level for the segment satisfies a volume threshold. In some examples, the example volume adjuster 202 is preconfigured with a desired volume level and a volume threshold. The example volume adjuster 202 may, in response to a segment not having an average volume level satisfying the threshold, adjust the gain of the overall audio signal to be presented. In some examples, the example volume adjuster 202 may utilize metadata corresponding to average volume levels for segments throughout the audio sample (e.g., running volume estimate data) to determine one or more gain values that may be implemented at one or more different segments of the audio signal. In some examples, the volume adjuster 202 may continually monitor media identifiers (e.g., fingerprints) pertaining to media in the audio signal to determine if a change in media being transmitted has occurred.

The example data store 204 of the illustrated example of FIG. 2 is a storage location for audio signals and other data utilized by the media unit 106. The data store 204 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The data store 204 may additionally or alternatively be implemented by one or more double data rate (DDR) memories, such as DDR, DDR2, DDR3, mobile DDR (mDDR), etc. The data store 204 may additionally or alternatively be implemented by one or more mass storage devices such as hard disk drive(s), compact disk drive(s) digital versatile disk drive(s), etc. While in the illustrated example the data store 204 is illustrated as a single database, the data store 204 may be implemented by any number and/or type(s) of databases. Furthermore, the data stored in the data store 660 may be in any data format such as, for example, binary data, comma delimited data, tab delimited data, structured query language (SQL) structures, etc. In some examples, the example data store 204 and the example metadata database 206 may be the same storage location. In some examples, the data store 204 may be a virtual storage location (e.g., a server accessible via a network).

The example metadata database 206 is a storage location for metadata corresponding to media. The example metadata database 206 provides metadata to the example metadata accessor 214 pertaining to media that has been identified in the audio signal by the example audio signal identifier 212. In some examples, the metadata stored in the metadata database 206 includes information such as average volume information for units of media (e.g., tracks, songs, etc.) and/or average volume information for segments of units of media (e.g., three second intervals throughout a song). The example metadata database 206 may be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The metadata database 206 may additionally or alternatively be implemented by one or more double data rate (DDR) memories, such as DDR, DDR2, DDR3, mobile DDR (mDDR), etc. The metadata database 206 may additionally or alternatively be implemented by one or more mass storage devices such as hard disk drive(s), compact disk drive(s) digital versatile disk drive(s), etc. While in the illustrated example the metadata database 206 is illustrated as a single database, the metadata database 206 may be implemented by any number and/or type(s) of databases. Furthermore, the data stored in the metadata database 206 may be in any data format such as, for example, binary data, comma delimited data, tab delimited data, structured query language (SQL) structures, etc.

The example dynamic range compressor 208 of the illustrated example of FIG. 2 is capable of compressing and/or expanding the dynamic range of audio signals that are not identified and/or audio signals for which corresponding metadata is not available to meet the desired volume requirement. In some examples, the dynamic range compressor 208 performs audio dynamic range compression and/or audio dynamic range expansion such that the signal has an average volume level that satisfies the volume threshold related to the desired volume level. In some examples, the dynamic range compressor runs continuously in the background and it activated whenever the volume adjuster 216 is unable to dynamically adjust the volume of the audio signal due to a lack of metadata, or a lack of identifiable media. The example dynamic range compressor 208 performs compression such that when the audio signal has a volume amplitude that does not satisfy the volume threshold related to the desired volume value, the signal is compressed or expanded instantaneously. In such examples, the local dynamic range of the audio signal may be altered due to the compression or expanded. In some examples, the example dynamic range compressor 208 forwards the audio signal, or a portion of the audio signal, to the real time audio monitor 218 after the audio signal, or a portion of the audio signal, has been compressed.

The example audio signal accessor 210 of the illustrated example of FIG. 2 accesses audio signals for processing. In some examples, the example audio signal accessor 210 receives signals from the media devices 102, 104 of the illustrated example of FIG. 1. In some examples, the audio signal accessor 210 retrieves audio signals from the data store 204, which may act as a temporary buffer for incoming audio signals prior to processing. In some examples, the audio signal accessor 210 implements a buffer (e.g., a one second buffer) which results in a delay between a time the audio signal is initially accessed and a time the audio signal is output, to provide the dynamic volume adjuster 202 with time for analysis and volume adjustment. During the buffer period, the audio signal can be identified by the audio signal identifier 212, metadata can be retrieved for the audio signal by the metadata accessor 214, volume levels can be compared with reference audio levels (e.g. from the metadata, from a historical volume setting, etc.), volume levels of portions of the audio signal can be adjusted, and/or volume levels of the entirety of the audio signal can be adjusted. Any analysis and/or volume adjustment steps may occur during the buffer period to improve volume consistency, user experience, and/or volume level safety. The example audio signal accessor 210 may receive audio signals from any source, and of any format. The audio signal accessor 210 of the illustrated example communicates audio signals to the real time audio monitor 218, the audio signal identifier 212, and/or any other component of the media unit 106.

The example audio signal identifier 212 of the illustrated example of FIG. 2 identifies media corresponding to the audio signal that is accessed by the example audio signal accessor 210. In some examples, the audio signal identifier 212 performs a comparison of a media identifier (e.g., a fingerprint) embedded in an audio signal with known or reference audio signatures to determine media of the audio signal. In the event that the example audio signal identifier 212 does not find a signature in the media to perform identification, the example audio signal identifier 212 directs the dynamic range compressor 208 to perform dynamic compression of the audio signal. Similarly, in the event that the example audio signal identifier 212 finds a signature but is unable to determine the media based on a match with a reference, the example audio signal identifier 212 directs the dynamic range compressor 208 to perform dynamic compression of the audio signal. In some examples, the example audio signal identifier 212 is able to find a matching reference signature. In such examples, the audio signal identifier 212 may pass the identification information to the example metadata accessor 214 to access metadata corresponding to the media. In some examples, the audio signal identifier 212 may interact with an external database (e.g., at a central facility) to find a matching reference signature. In some examples, the audio signal identifier 212 may interact with an internal database (e.g., the data store 204 and/or the metadata database 206) to find a matching reference signature. In some examples, the audio signal identifier 212 utilizes watermarks to identify the audio signal. In some example, the audio signal identifier 212 utilizes other identifies (e.g., a catalog identifier embedded in an ID3 tag, an ISRC identifier, etc.) to identify the audio signal. The audio signal identifier 212 may utilize any technique to identify the audio signal.

The example metadata accessor 214 of the illustrated example of FIG. 2 is capable of accessing metadata corresponding to media identified by the audio signal identifier 212. In some examples, the metadata accessor 214 extracts information pertaining to an average volume of a unit of media (e.g., a track) and running volume levels throughout the unit of media (e.g., the track). In some examples, the metadata may be retrieved from the metadata database 206. In some examples, the metadata may be retrieved from an external location (e.g., a storage location at a central facility, a storage location accessible via a network, etc.). In some examples, the available metadata may be processed by the metadata accessor 214 to provide usable data for the dynamic volume adjuster 202. In some examples, volume metrics may be processed using existing techniques and standards (e.g., algorithms to measure audio programmer loudness as presented in ITU-R standard BS.1770-4, which is hereby incorporated by reference herein). For example, the metadata may include volume information at every segment of time and the metadata accessor 214 may determine an average volume for an entire span of time. In some examples, the metadata accessor 214 may perform any calculations or transformations necessary to arrive at useful data to perform dynamic volume adjustment. In some examples, the metadata accessed by the metadata accessor 214 may include a value representing the difference between the average volume of the media and the desired volume, which may subsequently be used to apply an average gain to the audio signal.

The example volume adjuster 216 of the illustrated example of FIG. 2 adjusts the volume level of an audio signal. In some examples, the example volume adjuster 216 determines a single average gain value that will transform the volume of an audio signal from a known volume value (e.g., as indicated in the metadata) to a desired volume value (e.g., a preconfigured value). In such examples, the example volume adjuster 216 applies the gain value to the entire audio signal to transform the audio signal. In some examples, the example volume adjuster 216 may additionally or alternatively apply a gain value in real-time to an audio signal that is being output in response to the output level (e.g., volume level) that has been fed back from the real time audio monitor 218 and the average volume level for a specified segment of the audio signal (e.g., a sample or multiple samples) not satisfying the volume threshold (e.g., satisfying a volume target) related to the desired volume level. In some examples, the example volume adjuster 216 may apply a global gain value to the entire audio signal based on the average volume level indicated by the metadata for the media. In some examples, the example volume adjuster 216 may apply a local gain value to areas of the audio signal that have significantly different (e.g., lower or higher) volumes than other segments of the audio signal, based on large volume changes indicated in the metadata and/or based on real-time data collected by the example real time audio monitor 218 that indicates the threshold has not been satisfied (e.g., the target output level has not been achieved). In some examples, the metadata retrieved by the metadata accessor 214 includes data indicating directly the appropriate gain to apply to the audio signal to achieve a desired volume level. In some examples, the example volume adjuster 216 may have forward-looking adjustment capabilities by using a continuous volume stream included in the metadata accessed by the metadata accessor 214. In some examples, the example volume adjuster 216 may work in tandem with the example real time audio monitor 218 and the metadata accessor 214 to make adjustments to the volume to account for changes in the dynamic range of an audio signal before these changes occur. For example, the continuous volume stream included in the metadata accessed by the metadata accessor 214 may indicate a large volume change that the volume adjuster 216 can correct for by applying a slow moving volume change before the large volume event occurs. Thus, prior to the volume change indicated in the metadata, the example volume adjuster 216 may gradually adjust the gain value to the audio signal and consequently adjust the volume of the media.

In addition, the real time audio monitor 218 may indicate that the volume threshold is not satisfied (e.g., the target volume level is not achieved) and supply the volume adjuster 216 with an additional correction factor to be applied in real time. In some examples, a slow and imperceptible shift in the dynamic range of the audio may result from the application of the correction factor, in contrast to the compression that is applied by the example dynamic range compressor 208.

In some examples, the volume adjuster 216 makes a single volume adjustment at a time when new media is detected and/or when a new source is detected. Such an approach may be preferable in some examples compared to continual volume adjustments, as a single volume adjustment can be made to normalize between sources and between media, and then this desired volume level can be maintained (thereby avoiding noticeable volume adjustments) until a new source or new media is detected. In some such examples, the volume adjuster 216 computes a first gain based on the average volume of the media as indicated in the metadata to enable normalization between different media, and a second gain based on a comparison of the input audio signal and an instantaneous volume measurement represented in the metadata to enable normalization of volume between sources. The volume adjuster 216 utilizes an unaltered volume of the input audio signal to determine the second gain value by comparing this initial, unaltered volume with the instantaneous volume in the metadata from the metadata accessor 214. The volume adjuster 216 then computes an applied gain value based on both the first and second gain values, and adjusts the volume of the input audio signal based on this applied gain value. In some such examples, the first and the second gain values are both based on volume measurements before a gain value is applied (e.g., based on the unaltered input audio signal).

In some examples, the volume adjuster 216 adjusts volume levels for only portions of the audio signal. For example, the volume adjuster 216 may adjust a volume level for a specific channel (e.g., increasing volume in the center channel in a 5.1 mix to improve perceptibility of dialog in a movie).

In some examples, the volume levels configured by the volume adjuster 216 are stored as historical data. In some examples, historical volume levels are utilized when a source changes (e.g., a transition from radio to auxiliary input, a transition from a CD to a radio input, etc.) to set an initial volume level. In some examples, the real time audio monitor 218 compares current volume levels with historical volume levels associated with a source and/or with a user and causes the volume adjuster 216 to adjust volume levels accordingly (e.g., reduce volume levels to conform with a user's historical preference, reduce volume levels to remain within a safe listening volume range, etc.).

The example real time audio monitor 218 of the illustrated example of FIG. 2 collects real time volume measurement data, generates average volume levels for samples of the audio signal, and determines if a segment of the audio signal has an average volume value that does not satisfy the volume threshold (e.g., the target volume) related to the desired volume level. The example real time audio monitor 218 monitors the input audio signal accessed by the audio signal accessor 210 and the audio output of the media unit 106 after audio signals have been altered by the volume adjuster 216 and/or after audio signals have been altered by the dynamic range compressor 208. In some examples, the real time audio monitor 218 may collect volume data directly from the processed audio signals prior to the output of the processed audio signals. In some examples, the real time audio monitor 218 may also collect volume data from a separate measurement device or mechanism (e.g., the volume stream from the metadata accessed by the metadata accessor 214). The example real time audio monitor 218, in response to determining a segment of the audio signal does not satisfy the volume threshold (e.g., the target volume) related to the desired volume level, may provide data to the volume adjuster 216. The example volume adjuster 216 may then subsequently apply a gain value locally or globally (e.g., throughout the entire audio signal) to correct the audio signal such that the audio signal then satisfies the volume threshold related to the desired volume level. In some examples, the example real time audio monitor 218 may be preconfigured with a sample interval range within which the real time audio level is calculated (e.g., seven hundred fifty milliseconds to three seconds). In some examples, the calculated output volume level is compared with the stream of data from the metadata accessed by the metadata accessor 214 within a sampling range (e.g., seven hundred fifty milliseconds to three seconds) to calculate the average volume level of the audio signal and the difference of this level from the target volume level. In some examples, the sample size, sample frequency, and other parameters (e.g., thresholds) may be configurable.

In some examples where a gain value is calculated to normalize between sources, the real time audio monitor 218 determines an initial volume of the unaltered input audio signal and communicates this volume to the volume adjuster 216 for a gain value to be calculated. In some such examples, the real time audio monitor 218 may determine whether a source change has occurred or a change in media has occurred, thereby enabling the volume adjuster 216 to calculate a new gain value to normalize between different media and/or different sources.

In some examples, the real time audio monitor 218 compares current volume levels to a safe volume level range and/or a safe volume threshold. For example, the real time audio monitor 218 can be configured to cause a volume reduction when volume levels exceed a safe listening volume threshold.

The example audio signal outputter 220 of the illustrated example of FIG. 2 outputs the audio signal for presentation. In some examples, the audio signal outputter 220 performs transformations on the audio signal to meet requirements of the output device 110 of FIG. 1. In some examples, after an audio signal is compressed by the dynamic range compressor 208, it is transmitted to the audio signal outputter 220 of the dynamic volume adjuster 202. In some examples, the example audio signal outputter 220 is in direct communication with the real time audio monitor 218 to enable a final verification that the audio signal meets the volume requirements prior to transmitting the audio signal to an amplifier or output device.

While an example manner of implementing the media unit 106 of FIG. 1 is illustrated in FIG. 2, one or more of the elements, processes and/or devices illustrated in FIG. 2 may be combined, divided, re-arranged, omitted, eliminated and/or implemented in any other way. Further, the example dynamic volume adjuster 202, the example data store 204, the example metadata database 206, the example dynamic range compressor 208, the example audio signal accessor 210, the example audio signal identifier 212, the example metadata accessor 214, the example volume adjuster 216, the example real time audio monitor 218, the example audio signal outputter 220 and/or, more generally, the example media unit 106 of FIG. 1 may be implemented by hardware, software, firmware and/or any combination of hardware, software and/or firmware. Thus, for example, any of the example dynamic volume adjuster 202, the example data store 204, the example metadata database 206, the example dynamic range compressor 208, the example audio signal accessor 210, the example audio signal identifier 212, the example metadata accessor 214, the example volume adjuster 216, the example real time audio monitor 218, the example audio signal outputter 220 and/or, more generally, the example media unit 106 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example dynamic volume adjuster 202, the example data store 204, the example metadata database 206, the example dynamic range compressor 208, the example audio signal accessor 210, the example audio signal identifier 212, the example metadata accessor 214, the example volume adjuster 216, the example real time audio monitor 218, the example audio signal outputter 220 and/or, more generally, the example media unit 106 is/are hereby expressly defined to include a non-transitory computer readable storage device or storage disk such as a memory, a digital versatile disk (DVD), a compact disk (CD), a Blu-ray disk, etc. including the software and/or firmware. Further still, the example media unit 106 of FIG. 1 may include one or more elements, processes and/or devices in addition to, or instead of, those illustrated in FIG. 2, and/or may include more than one of any or all of the illustrated elements, processes and devices.

Figure 3:
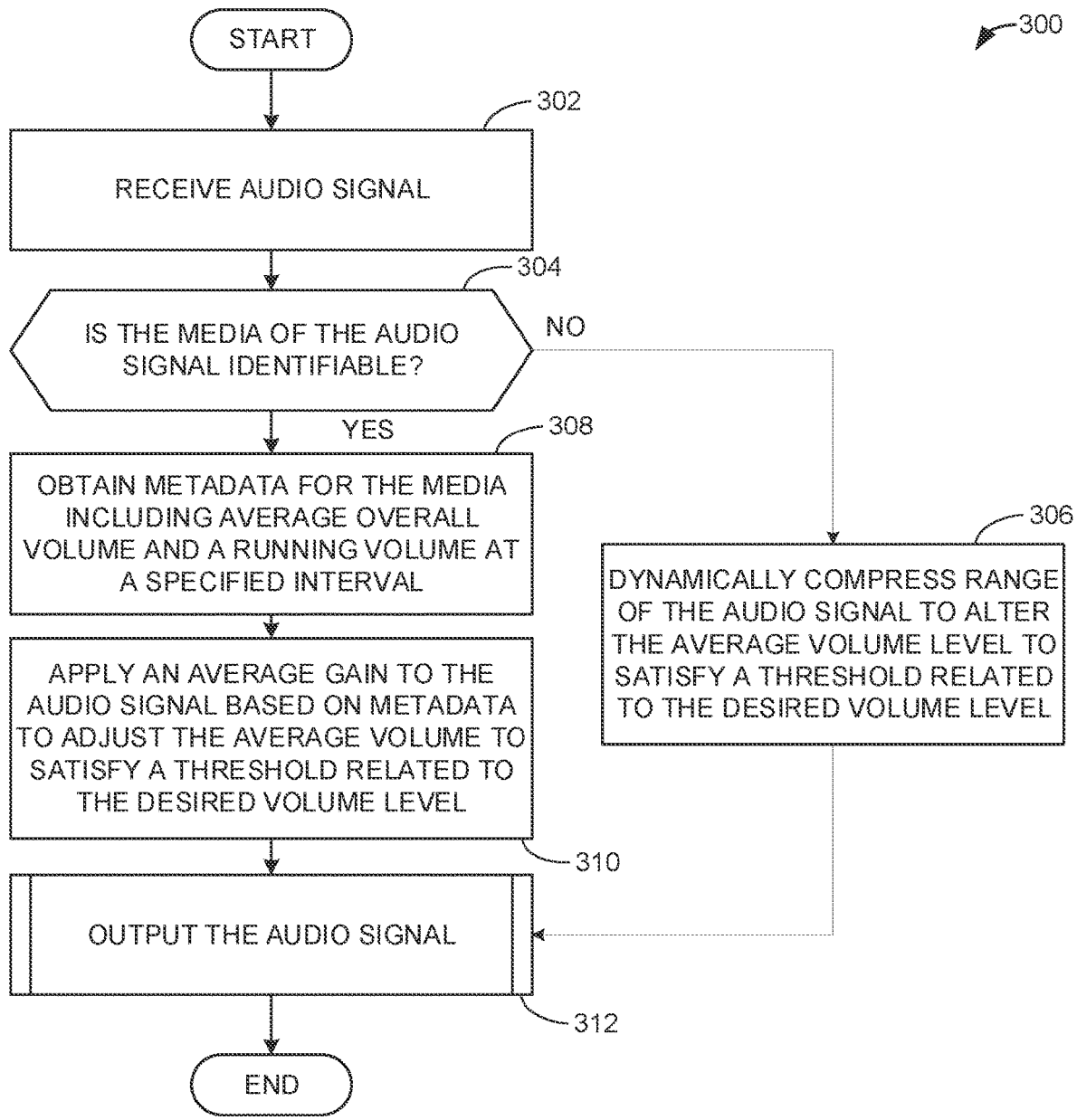
FIG. 3 is a flowchart representative of example machine readable instruction that may be used to implement the media unit 106 of FIGS. 1 and 2 to perform volume adjustment.
Figure 4:
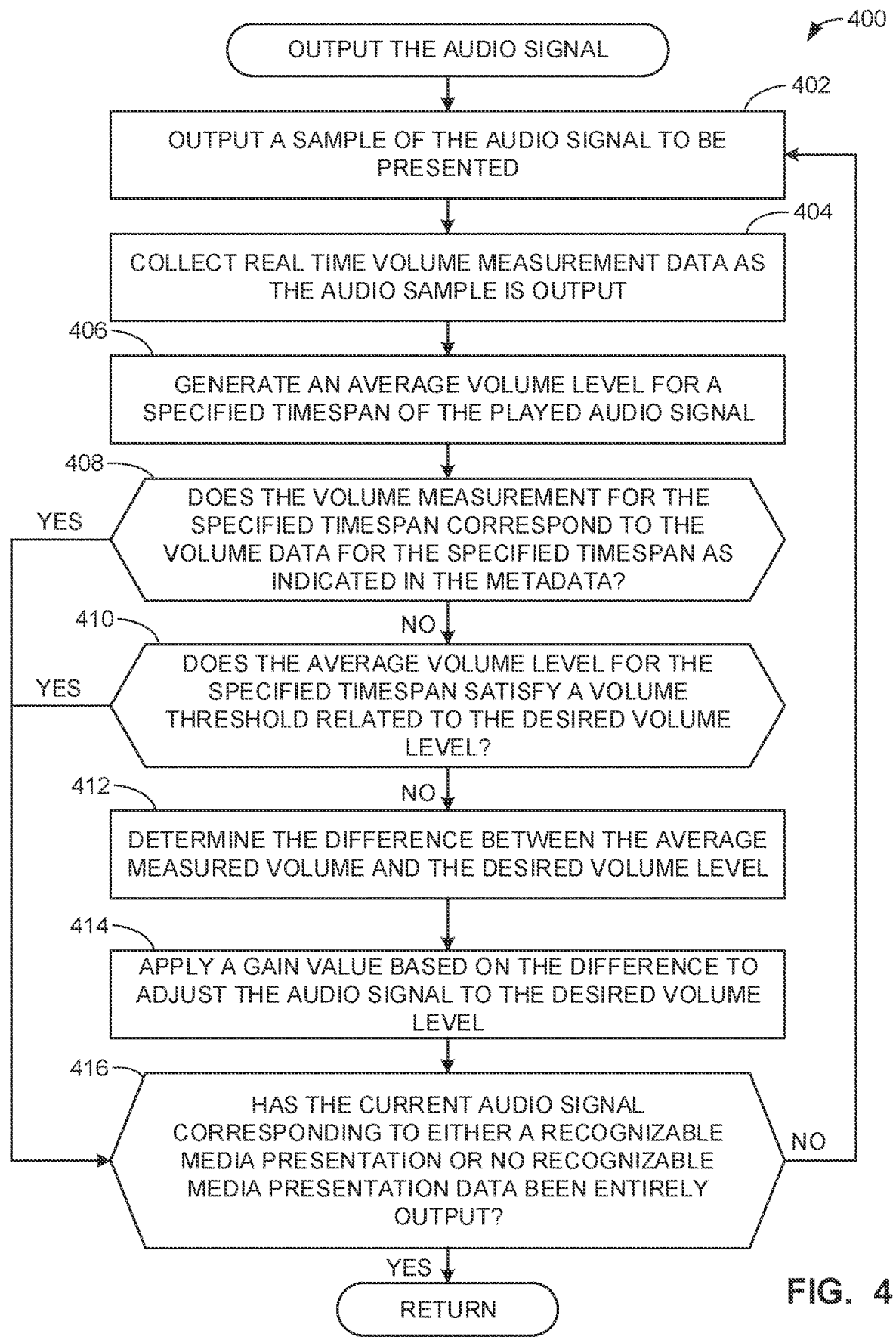
FIG. 4 is a flowchart representative of example machine readable instructions that may be used to implement the media unit 106 of FIGS. 1 and 2 to output the audio signal and provide real time volume adjustment of the audio signal.
Figure 5:
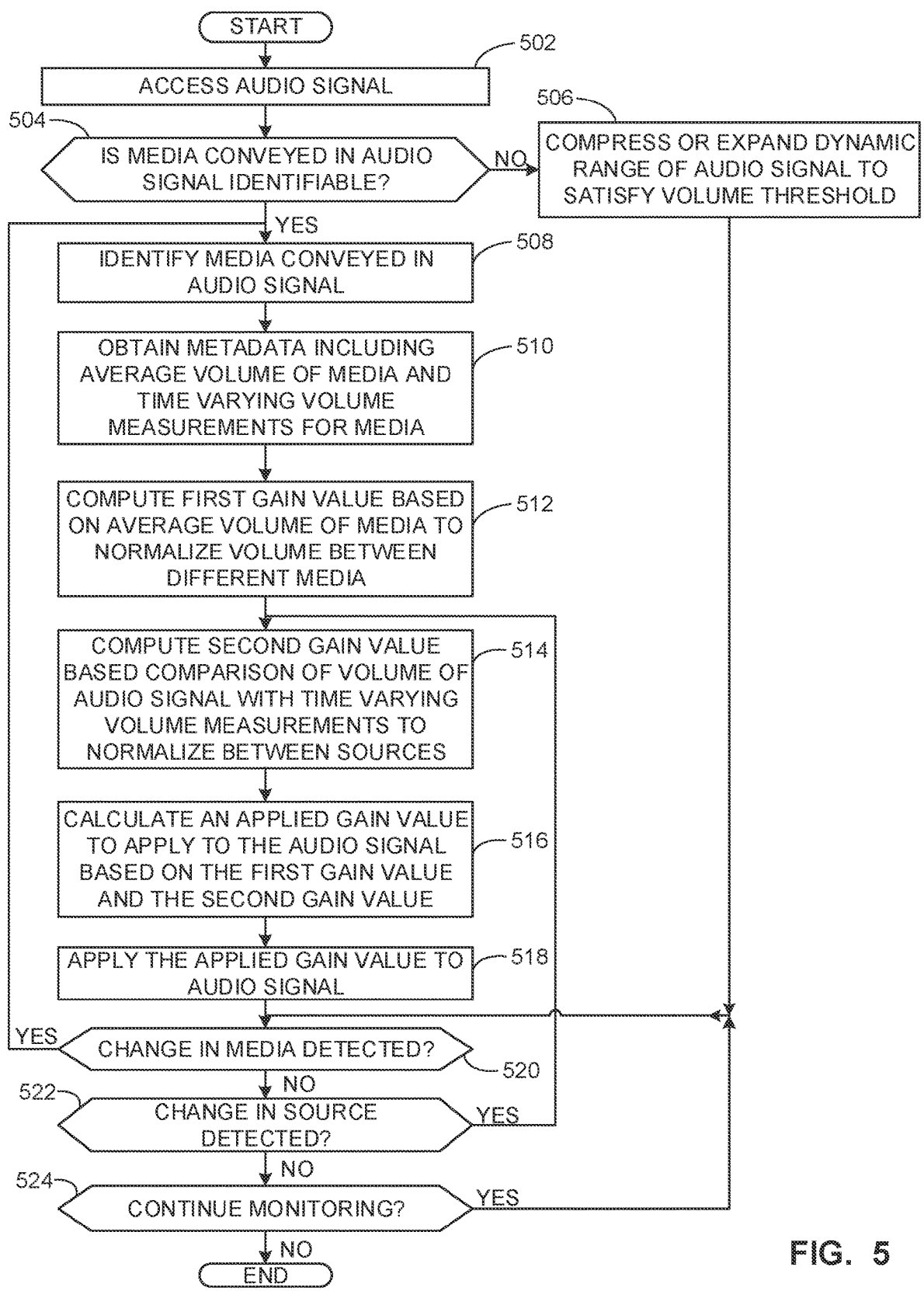
FIG. 5 is a flowchart representative of example machine readable instructions that may be used to implement the media unit 106 of FIGS. 1 and 2 to perform volume adjustment to normalize volume between sources and between media.

Flowcharts representative of example machine readable instructions for implementing the media unit 106 of FIGS. 1 and 2 are shown in FIGS. 3-5. In this example, the machine readable instructions comprise a program for execution by a processor such as a processor 612 shown in the example processor platform 600 discussed below in connection with FIG. 6. The program may be embodied in software stored on a non-transitory computer readable storage medium such as a CD-ROM, a floppy disk, a hard drive, a DVD, a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowcharts illustrated in FIGS. 3-5, many other methods of implementing the example media unit 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 3-5 may be implemented using coded instructions (e.g., computer and/or machine readable instructions) stored on a non-transitory computer and/or machine readable medium such as a hard disk drive, a flash memory, a read-only memory, a CD, a DVD, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open ended in the same manner as the term "comprising" and "including" are open ended.

Example machine readable instructions for implementing the media unit 106 of FIGS. 1 and 2 and that may be executed to perform volume adjustment of an audio signal are illustrated in FIG. 3. With reference to the preceding figures and associated descriptions, the example machine readable instructions 300 begin with the example dynamic volume adjuster 202 receiving an audio signal (Block 302). For example, the audio signal accessor 210 may receive an audio signal from any media source or may access an audio signal from any location.

At block 304, the example dynamic volume adjuster 202 determines if the media of the audio signal is identifiable. For example, the audio signal identifier 212 may determine if the media of the audio signal is identifiable. In some examples, the audio signal identifier 212 utilizes media identifiers (e.g., watermarks, ID3 tags, ISRC identifiers, etc.) embedded in the audio signal to compare to reference identifiers. In some examples, the audio signal identifier 212 may interact with a reference database located on the media unit 106 or located at a different location (e.g., a central facility). In such examples, the audio signal identifier 212 may provide the identifier to the reference database, where a search for a matching identifier may be performed. In some examples, the audio signal identifier 212 utilizes fingerprints derived from the audio signal to determine if the media represented in the audio signal is identifiable. The audio signal identifier 212 may utilize any technique to determine if media represented in the audio signal is identifiable. In response to the media of the audio signal being identifiable, processing transfers to block 308. Conversely, in response to the media of the audio signal not being identifiable, processing transfers to block 306.

At block 306, the example media unit 106 dynamically compresses the range of the audio signal to alter the average volume level to satisfy a threshold related to a desired volume level. In some examples, the dynamic range compressor 208 dynamically compresses the audio signal in response to the media of the audio signal not being identifiable. In some examples, the dynamic range compressor 208 compresses the audio incrementally such that the audio signal is compressed in areas where it does not satisfy the volume threshold. In some examples the dynamic range compressor 208 compresses the overall audio signal such that the average volume of the audio signal satisfies the threshold related to the desired volume.

At block 308, the example dynamic volume adjuster 202 obtains metadata for the media including an average overall volume and a running volume at a specified interval. For example, the example metadata accessor 214 may retrieve metadata corresponding to the media identified by the audio signal identifier 212 from a metadata database 206. In some examples, the example metadata accessor 214 receives data indicating an average overall volume for the media (e.g., an average volume for a track), as well as running volumes (e.g., multiple volume values throughout the media) at specified intervals (e.g., segments for which to calculate an average volume). In some examples, the metadata accessor 214 may access metadata including a value representing the difference between an average volume for the media and a desired volume. In such examples, the metadata may further include a gain value to be applied to the audio signal to achieve the desired volume. In some examples, the metadata accessor 214 may calculate any of these values (e.g., the average volume, the running volumes, the gain value, etc.) based on the metadata that is obtained. In some examples, the metadata accessor 214 may calculate the average volume for the media based on an average of average volumes corresponding to segments of the media. For example, the metadata accessor 214 may access metadata corresponding to average volume data in specified increments throughout the media. In such an example, the metadata accessor 214 may then calculate an average volume for the media (e.g., for the track) by averaging the average values for all segments of the track.

At block 310, the example dynamic volume adjuster 202 applies an average gain to the audio signal based on the metadata to adjust the average volume to satisfy a threshold related to the desired volume level. In some examples, the example volume adjuster 216 applies the average gain to the audio signal to adjust the average volume of the audio signal to satisfy a threshold related to the desired volume level. For example, the volume adjuster 216 may be configured with a desired volume level (e.g., negative twenty-one decibels loudness, K-weighted, relative to full scale) and a specified threshold which some or all volume averages must satisfy. For example, the threshold may be a deviation from the desired volume level or an acceptable range of volume levels. In some examples, the volume adjuster 216 accesses the average gain value directly from the metadata accessed by the metadata accessor 214. In some examples, the volume adjuster 216 calculates the average gain value based on the metadata accessed by the metadata accessor 214. In some examples, the volume adjuster 216 applies the average gain to the audio signal overall. In some examples, the volume adjuster 216 utilizes metadata pertaining to running volumes at specified intervals to apply different gain values to different segments of the media. The example volume adjuster 216 applies the average gain value as a way of adjusting the volume to satisfy the volume threshold without influencing the overall dynamics of the media.

At block 312, the example media unit 106 outputs the audio signal. In some examples, the example dynamic volume adjuster 202 outputs the audio signal. Detailed instructions to output the audio signal are provided in FIG. 4.

Example machine readable instructions for implementing the media unit 106 of FIGS. 1 and 2 and that may be executed to output the audio signal and provide real time volume adjustment of the audio signal are illustrated in FIG. 4. With reference to the preceding figures and associated descriptions, the example machine readable instructions 400 begin with the dynamic volume adjuster 202 outputting a sample of the audio signal to be presented. For example, the audio signal outputter 220 may output a sample of the audio signal to be output to an amplifier or output device. As used herein, the sample of the audio signal refers to a segment of the audio signal, as opposed to outputting the entire audio signal for presentation.

At block 404, the example dynamic volume adjuster 202 collects real time volume measurement data as the audio sample is output. For example, the real time audio monitor 218 collects data on the volume of the output audio signal. In some examples, the data collection may have a sample size (e.g., three seconds) over which to collect the volume measurements, as well as a sample frequency (e.g., every seven hundred and fifty milliseconds) referring to the frequency with which volume measurement data is collected. In some examples, the real time audio monitor 218 collects the data prior to the actual presentation of the audio signal to enable last minute corrections of the audio signal volume. In other examples, the real time audio monitor 218 collects the data as the audio signal is presented to enable corrections of the audio signal for subsequent presentation.

At block 406, the example dynamic volume adjuster 202 generates an average volume level for a specified timespan of the played audio signal. In some examples, the example real time audio monitor 218 generates the average volume level for the specified timespan of the played audio signal. In some examples, the example real time audio monitor 218 generates the average volume measurement pertaining to the output audio sample. In some examples, the specified timespan refers to the same duration of the sample of the audio signal. In other examples, the specified timespan may be different than the duration of the sample and may include multiple samples (e.g., a three second averaging timespan whereas samples are one second long).

At block 408, the example dynamic volume adjuster 202 determines if the volume measurement for the specified timespan corresponds to the volume data for the specified timespan as indicated in the metadata. For example, the real time audio monitor 218 may compare the generated average volume level with the metadata corresponding to the media represented by the audio signal. The example real time audio monitor 218 may determine if the volume measurement for the specified timespan corresponds to the volume data in the metadata by determining a difference between the average volumes and determining if the difference satisfies a matching threshold. In some examples, the audio signal may not be identified, and metadata may not be available for a comparison, resulting in the volume measurement not matching any volume data indicated in the metadata. In response to the volume measurement for the specified timespan not corresponding to the volume data for the specified timespan as indicated in the metadata, processing transfer to block 410. Conversely, in response to the volume measurement for the specified timespan corresponding to the volume data for the specified timespan as indicated in the metadata, processing transfers to block 416. In some examples, the example real time audio monitor 218 may additionally compare the volume measurement for the specified timespan to metadata corresponding to upcoming segments of the audio signal to determine if a volume change is anticipated. In such examples, the example real time audio monitor 218 may provide such forecasting information from the metadata to the volume adjuster 216 to adjust the volume gradually to account for upcoming changes of the volume and/or dynamic range of the audio signal.

At block 410, the example dynamic volume adjuster 202 determines if the average volume level for the specified timespan satisfies a volume threshold related to the desired volume level. For example, the real time audio monitor 218 may determine if the average volume level for the specified timespan satisfies the volume threshold related to the desired volume level (e.g., negative twenty-one decibels loudness, K-weighted, relative to full scale). In response to the average volume level for the specified timespan satisfying the volume threshold related to the desired volume level, processing transfers to block 414. Conversely, in response to the average volume for the specified timespan not satisfying the volume threshold related to the desired volume level, processing transfers to block 410.

At bock 412, the example dynamic volume adjuster 202 determines the difference between the average measured volume and the desired volume level. For example, the real time audio monitor 218 may subtract the desired volume level from the average volume level for the specified timespan to determine the difference between the two values.

At block 414, the example dynamic volume adjuster 202 applies a gain value based on the difference to adjust the audio signal to the desired volume level. For example, the volume adjuster 216 may calculate a gain value to apply to the audio signal based on the difference between the average measured volume and the desired volume level to adjust the audio signal to the desired volume level. In some examples, the volume adjuster 216 may apply the gain value to the remainder of the audio signal. In some examples the volume adjuster 216 may apply the gain value as long as the audio signal corresponds to the same media. In some examples, the volume adjuster 216 may apply the gain value locally to account for differences in volume levels at different segments in the audio signal.

At block 416, the example dynamic volume adjuster 202 determines if the current audio signal, corresponding to either a recognizable media presentation or no recognizable media presentation, has been entirely output. For example, the audio signal identifier 212 may determine if the current audio signal corresponding to either a recognizable media presentation or no recognizable media presentation data has been entirely output based on the presence (or lack thereof) of media identifiers in the audio signal. For example, the audio signal identifier 212 may continually monitor the audio signal for media identifiers. The example audio signal identifier 212 may then interpret a change in the media identifier, or a change in the presence of a media identifier (e.g., going from not finding a media identifier to finding a media identifier) as an indicator that the audio signal corresponding to a media presentation or no recognizable media presentation has been entirely output. The example audio signal identifier 212 performs this verification to check if a new audio signal is present which may require a new gain value to be computed based on available metadata, or require dynamic range compression to be performed if the media is unidentifiable. In response to the current audio signal corresponding to a recognizable media presentation or no recognizable media presentation having been entirely output, processing returns to the instructions of FIG. 3 and concludes. Conversely, in response to the current audio signal corresponding to a recognizable media presentation nor no recognizable media presentation not having been entirely output, processing transfers to block 402.

Example machine readable instructions for implementing the media unit 106 of FIGS. 1 and 2 and that may be executed to perform volume adjustment to normalize volume between sources and between media are illustrated in FIG. 5. With reference to the preceding figures and associated descriptions, the example machine readable instructions 500 begin with the example media unit 106 accessing an audio signal (Block 502). In some examples, the audio signal accessor 210 accesses an input audio signal.

At block 504, the example media unit 106 determines whether media conveyed in the audio signal is identifiable. In some examples, the audio signal identifier 212 determines whether media conveyed by the audio signal is identifiable. The audio signal identifier 212 may determine whether any watermarks, codes, and/or other identifiers are embedded in the audio signal. In some examples, the audio signal identifier 212 determines a signature based on the audio signal and determines whether the signature is represented in a storage location with reference signatures. In response to the media conveyed in the audio signal being identifiable, processing transfers to block 508. Conversely, in response to the media conveyed in the audio signal not being identifiable, processing transfers to block 506.

At block 506, the example media unit 106 compresses or expands the dynamic range of the audio signal to satisfy a volume threshold. In some examples, the dynamic range compressor 208 compresses or expands the dynamic range of the audio signal to satisfy the volume threshold. In some examples, the volume threshold is a range within which the volume of the audio signal must fall. In some examples, the volume threshold is a maximum or minimum volume value.

At block 508, the example media unit 106 identifies media conveyed in the audio signal. In some examples, the audio signal identifier 212 utilizes watermarks, codes, signatures, fingerprints, and/or any other identification techniques to identify the media conveyed in the audio signal.

At block 510, the example media unit 106 obtains metadata including an average volume of the media and time varying volume measurements for the media. In some examples, the metadata accessor 214 obtains the metadata including the average volume of the media and the time varying volume measurements for the media. The average volume for the media is a characteristic volume of the media. Different songs, for example, may have different average volume values. The average volume value can thus be utilized to help normalize volume levels between different media (e.g., different songs). The time varying volume measurements for the media include instantaneous volume measurements for the media at specific times. The time varying volume measurements can thus be utilized to compare an instantaneous volume of the input audio signal with the expected values represented in the metadata, enabling normalization of volume levels between different sources.

At block 512, the example media unit 106 computes a first gain value based on an average volume of the media to normalize the volume between different media. In some examples, the volume adjuster 216 computes the first gain value based on the average volume of the media to normalize the volume between different media. To compute the first gain value, the volume adjuster 216 computes the first gain value based on metadata from the metadata accessor 214 and a volume measured by the real time audio monitor 218. The first gain value represents a gain that accounts for the specific volume of the identified media. For example, a relatively quiet song may have a larger positive gain than a relatively louder song, in order to bring both songs to within a volume threshold range.

At block 514, the example media unit 106 computes a second gain value based on a comparison of the volume of the audio signal with time varying volume measurements to normalize between sources. In some examples, the example volume adjuster 216 computes a second gain value based on a comparison of the volume of the audio signal with time varying volume measurements to normalize between sources. For example, a media player connected to the media unit 106 via auxiliary input may have a different baseline volume than a CD. Thus, to normalize volume between different sources, an instantaneous comparison of the input volume with the time varying volume measurements of the metadata is performed to determine a gain to offset source-specific volume differences. The volume level of the input signal prior to the application of the first gain (the gain pertaining to the average volume of the media) is compared to the time-varying measurements for the media in the metadata. In some examples, the time varying volume measurements are not included in the metadata. In some such examples, the first gain value may be calculated and applied. Conversely, in some examples, the average volume measurement is not included in the metadata. In some such examples, the second gain value may be calculated and applied.

At block 516, the example media unit 106 calculates an applied gain value to apply to the audio signal based on the first gain value and the second gain value. In some examples, the volume adjuster 216 calculates the applied gain value to apply to the audio signal based on the first gain value and the second gain value. In some examples, the applied gain value may be based on only the first gain value or only the second gain value.

At block 518, the example media unit 106 applies the applied gain value to the audio signal. In some examples, the volume adjuster 216 applies the applied gain value to the audio signal.

At block 520, the example media unit 106 determines whether a change in media has been detected. In some examples, the audio signal identifier 212 determines whether a change in media has been detected based on a different identification of the media, or based on a loss of identification of the media (e.g., watermarks and/or other identifies no longer detected). In response to a change in media being detected, processing transfers to block 508. Conversely, in response to a change in media not being detected, processing transfers to block 522.

At block 522, the example media unit 106 determines whether a change in source has been detected. In some examples, the audio signal accessor 210 determines whether a change in source has been detected. In response to a change in source being detected, processing transfers to block 514. Conversely, in response to a change in source not being detected, processing transfers to block 524.

At block 524, the example media unit 106 determines whether to continue monitoring. In response to continuing monitoring, processing transfers to block 520. Conversely, in response to not continuing monitoring, processing terminates.

Figure 6:
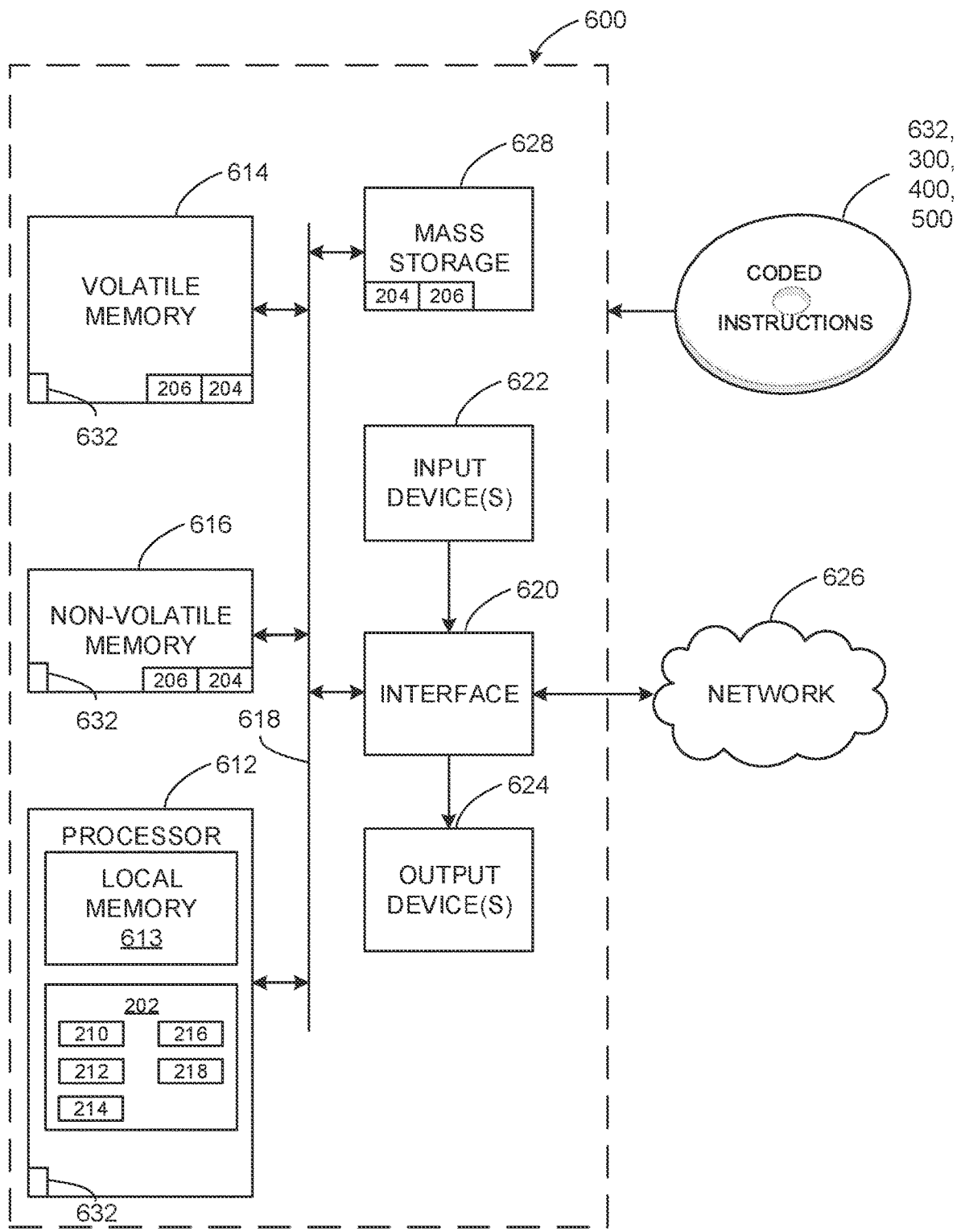
FIG. 6 is a schematic illustration of an example processor platform that may execute the instructions of FIGS. 3-5 to implement the example media unit 106 of FIGS. 1 and 2.

FIG. 6 is a block diagram of an example processor platform 600 capable of executing the instructions to implement the methods of FIGS. 3-5 to implement the example media unit 106 of FIGS. 1 and 2. The processor platform 600 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer. The hardware processor may be a semiconductor based (e.g., silicon based) device. In this example, the processor 612 implements the example dynamic volume adjuster 202, the example data store 204, the example metadata database 206, the example dynamic range compressor 208, the example audio signal accessor 210, the example audio signal identifier 212, the example metadata accessor 214, the example volume adjuster 216, the example real time audio monitor 218, the example audio signal outputter 220 and/or, more generally, the example media unit 106 of FIG. 1. The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a peripheral component interconnect (PCI) express interface.

In the illustrated example, one or more input devices 622 are connected to the interface circuit 620. The input device(s) 622 permit(s) a user to enter data and/or commands into the processor 612. The input device(s) can be implemented by, for example, an audio sensor, a microphone, a camera (still or video), a keyboard, a button, a mouse, a touchscreen, a track-pad, a trackball, an isopoint device, and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip and/or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, redundant array of independent disks (RAID) systems, and DVD drives.

The coded instructions 632 to implement the methods of FIGS. 3-5 may be stored in the mass storage device 628, in the volatile memory 614, in the non-volatile memory 616, and/or on a removable non-transitory computer readable storage medium such as a CD or DVD.

From the foregoing, it will be appreciated that example methods, apparatus and articles of manufacture have been disclosed that adjust the volume of media such that media with different initial volume characteristics can be played at approximately the same volume, without altering the original dynamics of the media. While conventional implementations of volume equalization continually adjust the volume and consequently cause perceptible changes to the audio signal, examples disclosed herein enable volume equalization using an adjustment by an average gain value based on metadata pertaining to the media. Additionally, examples disclosed herein describe techniques for real-time monitoring to adjust the volume of tracks in case of differences between the audio signal and the corresponding metadata media upon which the appropriate average gain was originally calculated. Such techniques are advantageous over conventional implementations since they are imperceptible to users and enable different media from different or similar sources to be played at substantially the same volume for a seamless media presentation experience.

An example apparatus to adjust volume is disclosed. The example apparatus includes an audio signal identifier to identify media represented in an audio signal, a metadata accessor to access metadata associated with the media in response to identifying the media in the audio signal and determine, based on the metadata, an average volume for the media. The example apparatus includes a volume adjuster to adjust an output volume of the audio signal based on an average gain value, the average gain value determined based on the average volume for the media.

In some examples, the example apparatus includes a real time audio monitor to determine a difference between an average measured volume of a sample of the audio signal and a desired volume level for a specified timespan, wherein the volume adjuster to adjust the volume of the audio signal based on a second gain value, the second gain value based on the difference.

In some examples, the average gain value is an initial volume adjustment applied to the audio signal and the second gain value is a subsequent volume adjustment applied to the audio signal.

In some examples, the example apparatus includes a dynamic range compressor to compress the audio signal when the audio signal identifier is unable to identify media represented in the audio signal.

In some examples, the example apparatus includes including an audio signal accessor to buffer the audio signal, the buffering to cause a delay in outputting the audio signal to provide time for identifying the media, accessing the metadata, and determining the average volume.

In some examples, the average gain value is determined based on a safe listening volume range.

In some examples, the average gain value is determined based on a historical volume setting for a source type of the audio signal.

An example non-transitory computer readable storage medium is disclosed herein. The example non-transitory computer readable storage medium comprises instructions that, when executed, cause a processor to at least identify media represented in an audio signal, access metadata associated with the media in response to identify the media in the audio signal, determine, based on the metadata, an average volume for the media, and adjust an output volume of the audio signal based on an average gain value, the average gain value determined based on the average volume for the media.

In some examples, the computer readable instructions, when executed, further cause the processor to determine a difference between an average measured volume of a sample of the audio signal and a desired volume level for a specified timespan, and adjust the volume of the audio signal based on a second gain value, the second gain value based on the difference.

In some examples, the average gain value is an initial volume adjustment applied to the audio signal and the second gain value is a subsequent volume adjustment applied to the audio signal.

In some examples, the computer readable instructions, when executed, cause the processor to compress the audio signal when media represented in the audio signal is not identified.

In some examples, the computer readable instructions, when executed, cause the processor to buffer the audio signal, the buffering to cause a delay in outputting the audio signal to provide time for identifying the media, accessing the metadata, and determining the average volume.

In some examples, the average gain value is determined based on a safe listening volume range.

In some examples, the average gain value is determined based on a historical volume setting for a source type of the audio signal.

An example method disclosed herein includes identifying media represented in an audio signal, accessing metadata associated with the media in response to identify the media in the audio signal determining, based on the metadata, an average volume for the media and adjusting an output volume of the audio signal based on an average gain value, the average gain value determined based on the average volume for the media.

In some examples, the method includes determining a difference between an average measured volume of a sample of the audio signal and a desired volume level for a specified timespan and adjusting the volume of the audio signal based on a second gain value, the second gain value based on the difference.

In some examples, the average gain value is an initial volume adjustment applied to the audio signal and the second gain value is a subsequent volume adjustment applied to the audio signal.

In some examples, the method further includes compressing the audio signal when the media represented in the audio signal is not identified.

In some examples, the method further includes buffering the audio signal, the buffering to cause a delay in outputting the audio signal to provide time for identifying the media, accessing the metadata, and determining the average volume.

In some examples, the average gain value is determined based on a safe listening volume range.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The invention claimed is:

1. A computing system comprising:
a processor; and
a non-transitory computer-readable storage medium, having stored thereon program instructions that, upon execution by the processor, cause performance of a set of operations comprising:
collecting data corresponding to a volume of an audio signal as the audio signal is output through a device;
determining an average volume value of the audio signal;
determining that a difference between the average volume value and a desired volume value is outside of a volume threshold; and
applying a gain to the audio signal to adjust the volume of the audio signal to the desired volume value, the gain determined based on the difference between the average volume value and the desired volume value.

2. The computing system of claim 1, wherein the set of operations further comprises:
compressing the audio signal when media represented in the audio signal is unidentifiable prior to the audio signal being output through the device.

3. The computing system of claim 1, wherein the set of operations further comprises:
buffering the audio signal to cause a delay in outputting the audio signal.

4. The computing system of claim 1, wherein the set of operations further comprises:
applying a second gain to the audio signal to adjust the average volume value of the audio signal prior to the audio signal being output through the device.

5. The computing system of claim 4, wherein the second gain is determined based on the average volume value of the audio signal.

6. The computing system of claim 1, wherein the set of operations further comprises:
collecting the data for a threshold period of time.

7. The computing system of claim 1, wherein the set of operations further comprises:
collecting the data over a threshold sample frequency.

8. A non-transitory computer-readable storage medium, having stored thereon program instructions that, upon execution by a processor, cause performance of a set of operations comprising:
   collecting data corresponding to a volume of an audio signal as the audio signal is output through a device;
   determining an average volume value of the audio signal;
   determining that a difference between the average volume value and a desired volume value is outside of a volume threshold; and
   applying a gain to the audio signal to adjust the volume of the audio signal to the desired volume value, the gain determined based on the difference between the average volume value and the desired volume value.

9. The non-transitory computer-readable storage medium of claim 8, wherein the set of operations further comprises:
   compressing the audio signal when media represented in the audio signal is unidentifiable prior to the audio signal being output through a device.

10. The non-transitory computer-readable storage medium of claim 8, wherein the set of operations further comprises:
   buffering the audio signal to cause a delay in outputting the audio signal.

11. The non-transitory computer-readable storage medium of claim 8, wherein the set of operations further comprises:
   applying a second gain to the audio signal to adjust the average volume value of the audio signal prior to the audio signal being output through the device.

12. The non-transitory computer readable storage medium of claim 11, wherein the second gain is determined based on the average volume value of the audio signal.

13. The non-transitory computer-readable storage medium of claim 8, wherein the set of operations further comprises:
   collecting the data for a threshold period of time.

14. The non-transitory computer-readable storage medium of claim 8, wherein the set of operations further comprises:
   collecting the data over a threshold sample frequency.

15. A method comprising:
   collecting data corresponding to a volume of an audio signal as the audio signal is output through a device;
   determining an average volume value of the audio signal;
   determining that a difference between the average volume value and a desired volume value is outside of a volume threshold; and
   applying a gain to the audio signal to adjust the volume of the audio signal to the desired volume value, the gain determined based on the difference between the average volume value and the desired volume value.

16. The method of claim 15, comprising:
   compressing the audio signal when media represented in the audio signal is unidentifiable prior to the audio signal being output through the device.

17. The method of claim 15, further comprising:
   buffering the audio signal to cause a delay in outputting the audio signal.

18. The method of claim 15, further comprising:
   applying a second gain to the audio signal to adjust the average volume value of the audio signal prior to the audio signal being output through the device.

19. The method of claim 18, wherein the second gain is determined based on the average volume value of the audio signal.

20. The method of claim 15, further comprising:
   collecting the data for a threshold period of time.

* * * * *